(12) United States Patent
Wiederin

(10) Patent No.: US 10,746,420 B1
(45) Date of Patent: Aug. 18, 2020

(54) SYSTEM FOR HUMIDIFYING GAS STREAMS

(71) Applicant: Elemental Scientific, Inc., Omaha, NE (US)

(72) Inventor: Daniel R. Wiederin, Omaha, NE (US)

(73) Assignee: ELEMENTAL SCIENTIFIC, INC., Omaha, NE (US)

( * ) Notice: Subject to any disclaimer, the term of this patent is extended or adjusted under 35 U.S.C. 154(b) by 0 days.

(21) Appl. No.: 16/371,888

(22) Filed: Apr. 1, 2019

Related U.S. Application Data

(63) Continuation of application No. 15/018,576, filed on Feb. 8, 2016, now Pat. No. 10,247,432.

(60) Provisional application No. 62/112,693, filed on Feb. 6, 2015.

(51) Int. Cl.
*B01F 3/04* (2006.01)
*F24F 6/04* (2006.01)
*F24F 6/12* (2006.01)
*F24F 6/00* (2006.01)

(52) U.S. Cl.
CPC .............. *F24F 6/04* (2013.01); *B01F 3/0446* (2013.01); *B01F 3/04439* (2013.01); *F24F 6/12* (2013.01); *F24F 2006/008* (2013.01)

(58) Field of Classification Search
CPC ....... B01F 3/04439; B01F 3/0446; F24F 6/04; F24F 6/12; F24F 2006/008
USPC ................................ 261/75, 104, 119.1, 142
See application file for complete search history.

(56) References Cited

U.S. PATENT DOCUMENTS

| | | | | |
|---|---|---|---|---|
| 4,155,961 A | * | 5/1979 | Benthin | A61M 16/16 128/204.13 |
| 4,355,636 A | * | 10/1982 | Oetjen | A61M 16/16 128/204.13 |
| 4,367,734 A | * | 1/1983 | Benthin | A61M 16/16 128/204.13 |
| 4,381,267 A | * | 4/1983 | Jackson | A61M 16/16 128/204.13 |
| 5,738,808 A | * | 4/1998 | Iwamoto | A61M 16/16 128/204.13 |
| 6,896,247 B2 | * | 5/2005 | Brotzeller | G01N 23/20 261/104 |
| 7,866,637 B2 | * | 1/2011 | Van Der Net | C10J 1/06 261/104 |
| 10,247,432 B1 | * | 4/2019 | Wiederin | F24F 6/04 |
| 2004/0245658 A1 | * | 12/2004 | Niland | A61M 16/16 261/104 |
| 2007/0246847 A1 | * | 10/2007 | Bitoh | H01M 8/04126 261/104 |
| 2013/0087936 A1 | * | 4/2013 | Brenner | B01D 69/02 261/100 |

* cited by examiner

*Primary Examiner* — Charles S Bushey
(74) *Attorney, Agent, or Firm* — Kevin E. West; Advent, LLP

(57) ABSTRACT

In accordance with embodiments of this disclosure, a gas humidifier system includes a reservoir of liquid with at least one selectively permeable tube at least partially submerged within the liquid. A gas stream may be fed into the selectively permeable tube that passes through the liquid reservoir. The selectively permeable tube may be substantially impermeable to the gas flowing therethrough but permeable to vapor (e.g., water vapor) entering the selectively permeable tube from the liquid. Thus, vapor from the liquid reservoir can enter the selectively permeable tube and humidify the gas flowing therethrough.

17 Claims, 3 Drawing Sheets

SYSTEM FOR HUMIDIFYING GAS STREAMS

CROSS-REFERENCE TO RELATED APPLICATIONS

The present application is a continuation under 35 U.S.C. § 120 of U.S. patent application Ser. No. 15/018,576 filed Feb. 8, 2016, and titled "SYSTEM FOR HUMIDIFYING GAS STREAMS", U.S. patent application Ser. No. 10/247,432 is incorporated herein by reference in its entirety.

BACKGROUND

For various applications including, but not limited to, inductively coupled plasma (ICP) emission or mass spectrometry, it is beneficial to humidify gas streams. Bubbling-type humidifiers with a single reservoir can be used to humidify a flow of dry gas, which can be divided into two or more streams after humidification. To accurately control flow rate, the wet (humidified) gas must pass through a control device (e.g., gas flow controller). A drawback to this approach is that the wet gas can cause corrosion or instability of the control device due to condensation. Additionally, a bubbling-type humidifier with a single reservoir is not able to simultaneously humidify two different gas streams having different chemical composition.

SUMMARY

The present disclosure is directed to a gas humidifier system that includes a reservoir of liquid with at least one selectively permeable tube at least partially submerged within the liquid. At either ambient or elevated temperature, the liquid is used to humidify one or more independently controlled gas streams. In some embodiments, each gas stream is fed into a respective selectively permeable tube that passes through the liquid reservoir. A flow rate of each gas stream can be controlled, independently, before the dry (non-humidified) gas is directed through the liquid reservoir (i.e., through a submerged portion of the respective selectively permeable tube). The selectively permeable tube may be substantially impermeable to the gas flowing therethrough but permeable to vapor (e.g., water vapor) entering the selectively permeable tube from the liquid. Thus, vapor from the liquid reservoir can enter the selectively permeable tube and humidify the gas flowing therethrough.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Inductively coupled plasma (ICP) emission or mass spectrometry techniques can be used to measure the presence of chemical elements in liquid samples. In most cases, before introduction to the ICP, liquid samples are first dispersed into an aerosol by introduction of a first gas called nebulizing gas (e.g., argon) into a nebulizer. The nebulized aerosol can then be directed into a spray chamber which has physical properties that impact and remove the larger aerosol particles and direct the desirable fine aerosol particles into an ICP injector and then into the ICP for atomization and ionization followed by measurement using the spectrometer.

In some cases a second gas is introduced through a second port of the spray chamber to independently optimize instrument signal or to provide a convenient mechanism for controlling the rate of introduction of nebulized aerosol into the ICP, thereby controlling the extent of matrix suppression when samples with high levels of dissolved solids (>0.1% by weight) are analyzed.

The first gas and second gas flows or streams may be accurately controlled, both in total and relative to each other, to ensure instrument stability. A third or fourth spray chamber gas stream can also be used. For example, the addition of gases such as $O_2$ or $CH_4$ can be used for applications including, but not limited to, the analysis of organic solvents or for detection of low levels of elements such as As and Se.

Common sources of the first and second gases include compressed gas cylinders or liquefied gas, which at atmospheric pressure produce a gas with low humidity. When liquid samples include solutions containing a high concentration of dissolved solids (e.g., greater than 0.1% by weight) it is beneficial to humidify the first gas (nebulizer gas) to prevent formation of salt deposits in the nebulizer which would otherwise lead to instrument drift. Humidification of the second gas stream can also be beneficial to wet the aerosol particles and provide a wet surface to which the larger aerosol particles can adhere, helping to ensure that the larger aerosol particles are sorted from the desired fine aerosol.

Example System Implementations

Figure 1:
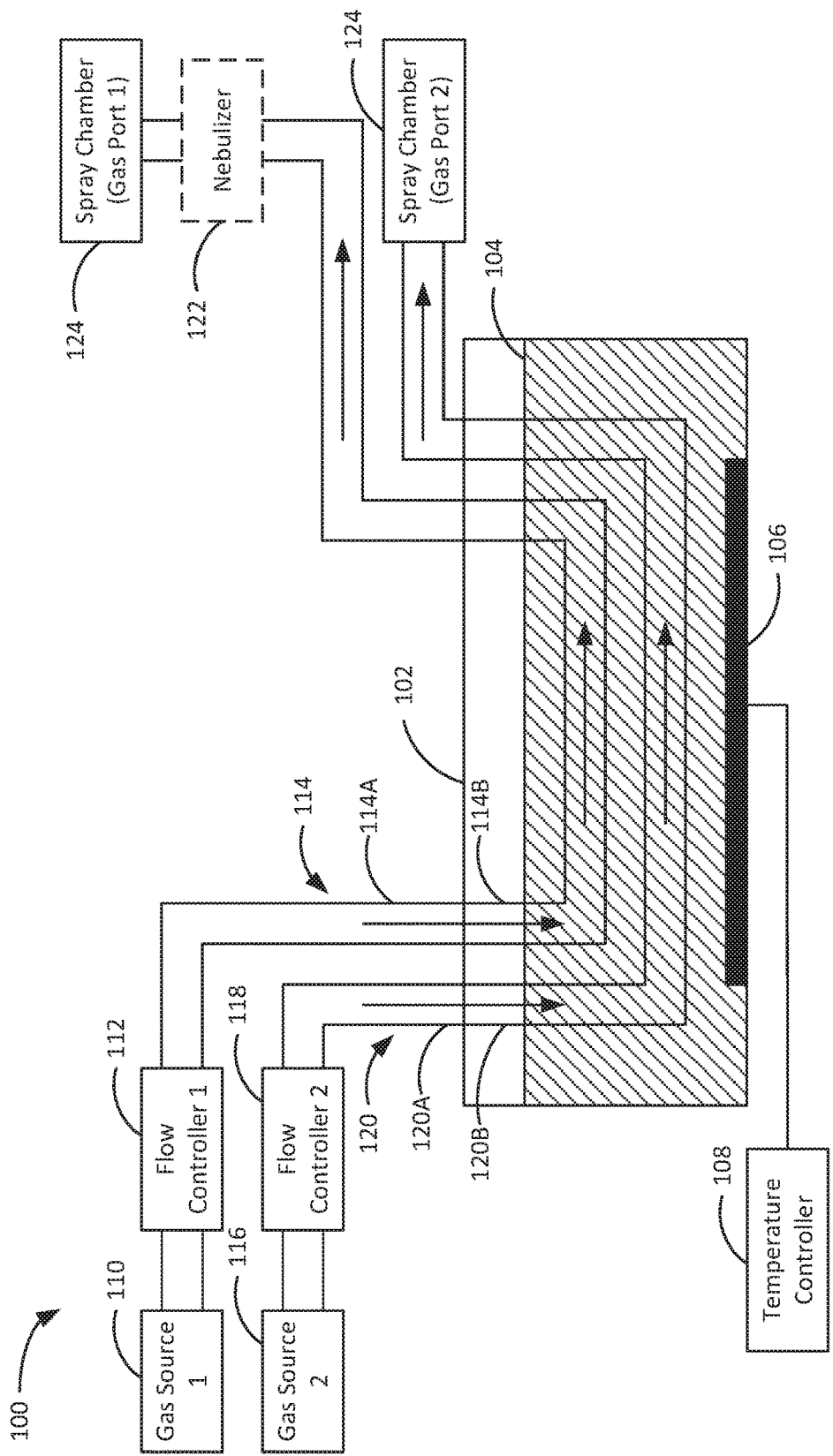
FIG. 1 is schematic diagram of a gas humidifying system in accordance with embodiments of this disclosure.
Figure 2A:
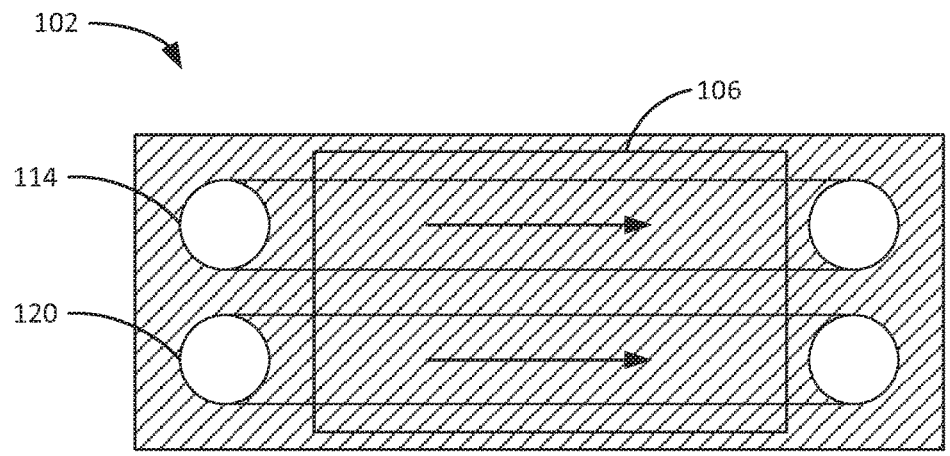
FIG. 2A is a top view of a liquid reservoir of the gas humidifying system in accordance with embodiments of this disclosure.
Figure 2B:
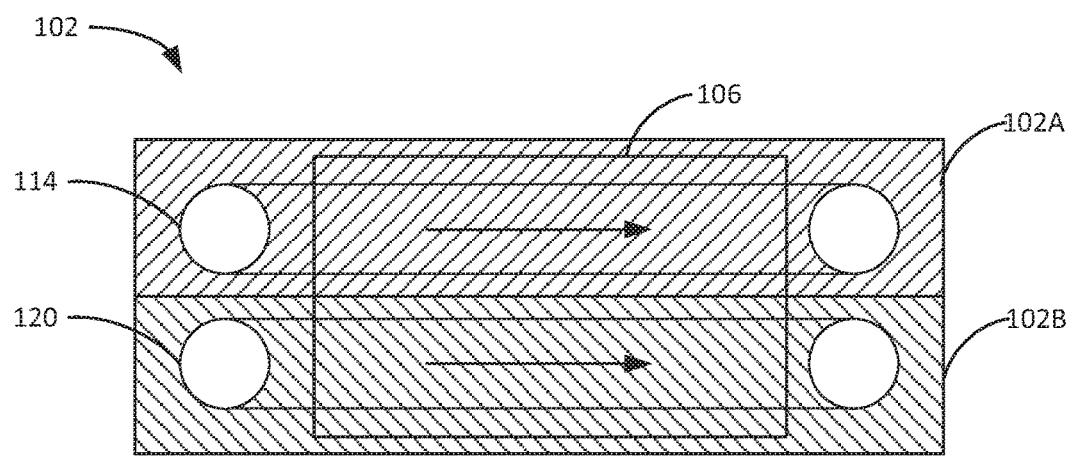
FIG. 2B is a top view of multiple adjacent liquid reservoirs of the gas humidifying system in accordance with embodiments of this disclosure.

FIGS. 1 through 2B illustrate a gas humidifying system 100 in accordance with various embodiments of this disclosure. Those skilled in the art will appreciate that the embodiments illustrated in the drawings and/or described herein may be fully or partially combined and/or modified to result in additional embodiments. Accordingly, the illustrated and described embodiments should be understood as explanatory and not as limitations of the present disclosure.

In an embodiment illustrated in FIG. 1, the gas humidifying system 100 is shown to include a reservoir 102 containing a liquid 104 (e.g., water). The system further includes at least one selectively permeable tube 114 (e.g., NAFION tubing) fluidically coupled with a gas source 110, where the selectively permeable tube 114 is at least partially submerged within the liquid 104. In some embodiments, the selectively permeable tube includes a first portion 114A, which may or may not be selectively permeable, and a second portion 114B that is selectively permeable. For example, the selectively permeable portion 114B or the entire tube 114 can be substantially impermeable to gas flowing therethrough from the gas source 110 and at least partially permeable to vapor entering the selectively permeable tube 114 from the liquid 104. Thus, vapor from the liquid 104 in the reservoir 102 can enter the selectively permeable tube 114 and humidify the gas stream flowing therethrough.

In some embodiments, the first portion 114A and the second portion 114B are separate tubes, where at least the second tube 114B is selectively permeable. For example, the first tube 114A may be connected to an exterior port of the reservoir 102, and the second (selectively permeable) tube may be connected to an interior port of the reservoir 102, where the exterior port and the interior port are fluidically coupled to one another.

In some embodiments, a gas flow controller 112 (e.g., a manually or electromechanically controllable valve) is fluidically coupled with the gas source 112 and the selectively permeable tube 114. The gas flow controller 112 can be configured to control a flow rate of a gas stream flowing from the gas source 110 prior to passage of the gas stream through a submerged portion of the selectively permeable tube 114. By controlling the gas flow rate of the gas stream prior to humidification, corrosion or instability of the gas flow controller 112 may be prevented.

For ICP spectrometry applications, among others, a nebulizer 122 (e.g., an analytical nebulizer) can be fluidically coupled with the selectively permeable tube 114. The nebulizer 112 may be configured to receive and nebulize a (humidified) gas stream flowing from the gas source 110 after passage of the gas stream through a submerged portion of the selectively permeable tube 114. The nebulized gas can then be fed from the nebulizer 122 into a spray chamber 124 via a respective port (e.g., Gas Port 1).

In some embodiments, the system 100 further includes a heating element 106 thermally coupled with or forming a portion of the reservoir 102. The heating element 106 can serve to heat the liquid to a controlled temperature. For example, the heating element can be manually controlled (e.g., with an adjustable knob or valve) or electronically controlled via a temperature controller 108 including electronic control circuitry.

As shown in FIG. 1, the system 100 can be configured to simultaneously humidify multiple gas streams from independent sources. For example, the system can include at least a second selectively permeable tube 120 fluidically coupled with a second gas source 116, where the second selectively permeable tube 120 is at least partially submerged within the liquid 104. In some cases, the second gas source 116 contains a different chemical composition (i.e. provides a different gaseous substance) than the first gas source 110. Because the tubes 114 and 120 are selectively permeable, the different gaseous substances provided by the first gas source 110 and the second gas source 116 can be directed through the same reservoir 102 (an humidified by the liquid 104 contained therein) without any risk of cross-contamination. As described above with regard to the first selectively permeable tube 114, the second selectively permeable tube 120 can include separate portions/tubes 120A and 120B, where at least the inner portion/tube 120B is selectively permeable. The second selectively permeable tube 120 can also be fluidically coupled with the spray chamber 124 via a respective port (e.g., Gas Port 2) for ICP spectrometry, as discussed above, or for other applications requiring two or more simultaneous humidified gas streams.

FIG. 2A shows a top view of the reservoir 102 with the first selectively permeable tube 114 and the second selectively permeable tube 120 at least partially submerged within the liquid 104 contained therein. FIG. 2B shows another embodiment of the system 100, where the reservoir 102 is partitioned into a first reservoir 102A and a second reservoir 102B adjacent to the first reservoir 102A. Each of the reservoirs/partitions 102A and 102B can have a respective one of the first and second selectively permeable tube 114 and 120 at least partially submerged within the liquid contained therein. This can be beneficial for some applications, for example, where sensitivity to cross-contamination is very high or where a different liquid used for humidifying each gas stream. The embodiment shown in FIG. 2B is illustrative of one implementation; however, it is to be understood that each of the first and second reservoirs 102A and 102B can be independent (i.e., not formed from partitions of reservoir 102).

In some embodiments, the liquid within the first and second reservoirs 102A and 102B is thermally controlled by the same heating element 106. For example, the heating element 106 can be thermally coupled with or can form a portion of each of the first reservoir 102A and the second reservoir 102B.

Those skilled in the art will appreciate the foregoing embodiments are not exhaustive. For example, the system 100 can include any number of reservoirs 102 having one or more selectively permeable tubes (e.g., tubes 114 and 120) at least partially submerged within the liquid 104 contained therein.

Example Process Implementations

Figure 3:
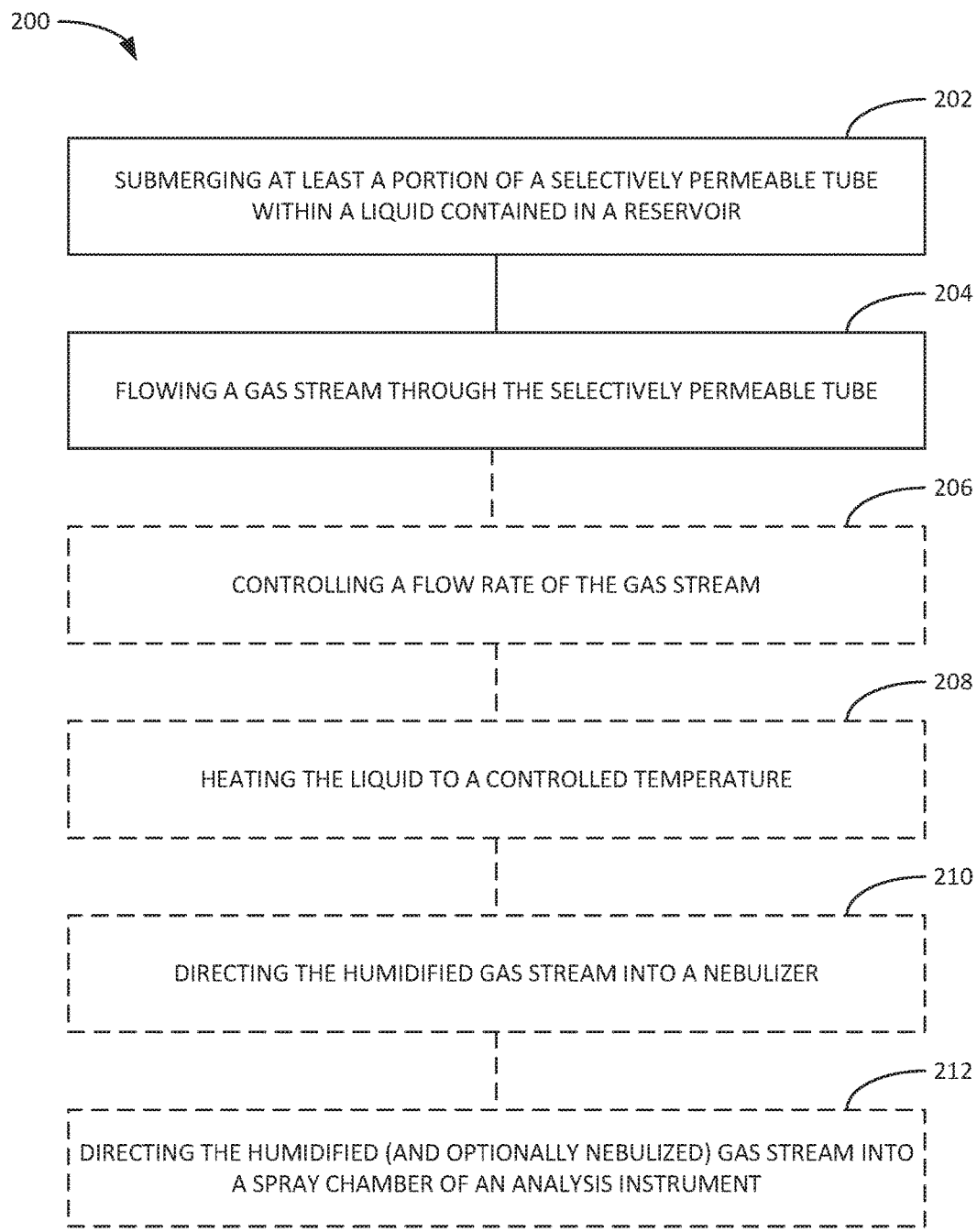
FIG. 3 is a flow diagram illustrating a method of humidifying at least one gas stream in accordance with implementations of this disclosure.

FIG. 3 is a flow diagram illustrating a method 200 for humidifying at least one gas stream in accordance with one or more disclosed implementations. In some implementations, the method 200 can be executed utilizing the system 100 described herein. In this regard, in addition to the steps or operations described below, the method 200 can further include any steps or operations disclosed with regard to embodiments of the system 100 described herein.

At block 202, a selectively permeable tube (e.g., a tube such as tube 114) is submerged within a liquid contained in a reservoir (e.g., water or any other appropriate liquid contained in a reservoir such as reservoir 102). In some implementations, only a portion of the partially submerged tube is selectively permeable (e.g., part or all of the submerged portion). In other implementations, the entirety of the tube is selectively permeable (i.e., permeable to vapor entering from the liquid in the reservoir but substantially impermeable to a gas stream flowing through the tube).

At block 204, a gas stream is flowed through the selectively permeable tube so that the gas stream can be humidified by vapor entering the tube from the liquid in the reservoir. For example, gas from a gas source, such as gas source 110, is directed into the selectively permeable tube, which is at least partially submerged in the liquid.

At block 206, the flow rate of the gas is optionally controlled (e.g., using a flow controller such as flow controller 112). In some implementations, the flow rate of the gas may be adjusted by a flow controller before the gas is flowed through the submerged portion of the selectively permeable tube.

At block 208, the temperature of the liquid in the reservoir is optionally controlled. For example, the liquid can be heated with a heating element, such as heating element 106 (e.g., a resistive, inductive, or electromagnetic (e.g., microwave) heating element). The heating element may be manually controlled (e.g., with an adjustable knob or valve) or electronically controlled via a temperature controller (e.g., temperature controller 108) that includes electronic control circuitry and/or a processor, microcontroller, ASIC, programmable logic device, or the like.

At blocks 210 and 212, the humidified gas stream (i.e., having passed through the submerged portion of the selectively permeable tube) may be supplied for analysis (e.g., for ICP emission or mass spectrometry analysis). At block 210, the humidified gas stream is optionally directed into a nebulizer, such as nebulizer 122. At block 212, the humidified gas stream in introduced into a spray chamber (e.g., spray chamber 124) of an analysis instrument (e.g., an ICP emission or mass spectrometry analysis instrument or the like). The spray chamber may be coupled to the instrument or can form a portion thereof, and is configured to direct at least a portion of the humidified (and optionally nebulized) gas to an analysis site (e.g., ICP torch) of the analysis instrument.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. A gas humidifier system, comprising:
    a reservoir configured to hold a liquid;
    a first selectively permeable tube for receiving a first flow of gas, the first selectively permeable tube extending through the reservoir so that at least a portion of the first selectively permeable tube is at least partially submerged within the liquid, wherein the first selectively permeable tube is substantially impermeable to the first flow of gas and is at least partially permeable to vapor entering the first selectively permeable tube from the liquid in the reservoir; and
    a second selectively permeable tube for receiving a second flow of gas, the second selectively permeable tube extending through the reservoir so that at least a portion of the second selectively permeable tube is at least partially submerged within the liquid, wherein the second selectively permeable tube is substantially impermeable to the second flow of gas and is at least partially permeable to vapor entering the second selectively permeable tube from the liquid in the reservoir, and wherein an interior of the second selectively permeable tube is physically separated from the first selectively permeable tube for preventing cross-contamination between the first flow of gas and the second flow of gas.

2. The gas humidifier system as recited in claim 1, further comprising a first gas flow controller fluidically coupled with the first selectively permeable tube, the first gas flow controller being configured to control the flow rate of the first flow of gas prior to passage of the first flow of gas through the at least partially submerged portion of the first selectively permeable tube.

3. The gas humidifier system as recited in claim 2, further comprising a second gas flow controller fluidically coupled the second selectively permeable tube, the second gas flow controller being configured to control the flow rate of the second flow of gas prior to passage of the second flow of gas through the at least partially submerged portion of the second selectively permeable tube.

4. The gas humidifier system as recited in claim 3, wherein the first selectively permeable tube receives the first flow of gas from a first gas source and the second selectively permeable tube receives the second flow of gas from a second gas source.

5. A system for humidifying at least two gas streams, comprising:
    a reservoir configured to hold a liquid;
    a first input for receiving a first gas stream;
    a first selectively permeable tube fluidically coupled with the first input for receiving the first gas stream, the first selectively permeable tube extending through the reservoir so that at least a portion of the first selectively permeable tube is at least partially submerged within the liquid;
    a second input for receiving a second gas stream; and
    a second selectively permeable tube fluidically coupled with the second input for receiving the second gas stream, the second selectively permeable tube extending through the reservoir so that at least a portion of the second selectively permeable tube is at least partially submerged within the liquid,
    wherein the first selectively permeable tube is substantially impermeable to gas from the first gas stream and is at least partially permeable to vapor entering the first selectively permeable tube from the liquid in the reservoir, wherein the second selectively permeable tube is substantially impermeable to gas from the second gas stream and is at least partially permeable to vapor entering the second selectively permeable tube from liquid in the reservoir, and wherein an interior of the first selectively permeable tube is physically separated from the second selectively permeable tube preventing cross-contamination between the first gas stream and the second gas stream.

6. The system as recited claim 5, further comprising a first gas flow controller fluidically coupled with the first input, the first gas flow controller being configured to control the flow rate of the first gas stream prior to passage of the first gas stream through the at least partially submerged portion of the first selectively permeable tube.

7. The system as recited in claim 6, further comprising a second gas flow controller fluidically coupled with the second input, the second gas flow controller being configured to control the flow rate of the second gas stream prior to passage of the second gas stream through the at least partially submerged portion of the second selectively permeable tube.

8. The system as recited in claim 7, wherein the first input receives the first gas stream from a first gas source and the second input receives the second gas stream from a second gas source.

9. A method for humidifying at least two gas streams, comprising:
    receiving a liquid into a reservoir configured to hold the liquid;
    receiving a first gas stream in a first selectively permeable tube extending through the reservoir so that at least a portion of the first selectively permeable tube is at least partially submerged within the liquid, the first selectively permeable tube being substantially impermeable to the first gas stream and is at least partially permeable to vapor entering the first selectively permeable tube from the liquid in the reservoir; and
    receiving a second gas stream in a second selectively permeable tube extending through the reservoir so that at least a portion of the second selectively permeable tube is at least partially submerged within the liquid, the second selectively permeable tube being substantially impermeable to the second gas stream and is at least partially permeable to vapor entering the second selectively permeable tube from liquid in the reservoir; wherein an interior of the first selectively permeable tube is physically separated from the second selectively permeable tube preventing cross-contamination between the first gas stream and the second gas stream.

10. The method as recited in claim 9, further comprising controlling, via a first gas flow controller fluidically coupled with the first selectively permeable tube, the flow rate of the first gas stream prior to passage of the first gas stream through the at least partially submerged portion of the first selectively permeable tube.

11. The method as recited in claim 10, further comprising controlling, via a second gas flow controller fluidically coupled with the second selectively permeable tube, the flow rate of the second gas stream prior to passage of the second gas stream through the at least partially submerged portion of the second selectively permeable tube.

12. The gas humidifier system as recited in claim 11, wherein the first selectively permeable tube receives the first gas stream from a first gas source and the second selectively permeable tube receives the second gas stream from a second gas source.

13. A method of humidifying at least two gas streams, comprising:
coupling a first input of a gas humidifier system with a first gas source, the first input fluidically coupled with a first selectively permeable tube extending through a reservoir of the gas humidifier system;
coupling a second input of the gas humidifier system with a second gas source, the second input fluidically coupled with a second selectively permeable tube extending through the reservoir of the gas humidifier system;
introducing a liquid into the reservoir to at least partially submerge at least a portion of each of the first selectively permeable tube and the second selectively permeable tube;
introducing a flow of gas from the first gas source through the first selectively permeable tube; and
introducing a flow of gas from the second gas source through the second selectively permeable tube,
wherein the first selectively permeable tube is substantially impermeable to the flow of gas from the first gas source and is at least partially permeable to vapor entering the first selectively permeable tube from the liquid in the reservoir, wherein the second selectively permeable tube is substantially impermeable to the flow of gas from the second gas source and is at least partially permeable to vapor entering the second selectively permeable tube from liquid in the reservoir, and wherein an interior of the first selectively permeable tube is physically separated from the second selectively permeable tube preventing cross-contamination between the flow of gas from the first gas source and the flow of gas from the second gas source.

14. The method as recited in claim 13, further comprising:
directing the flow of gas from the first gas source into a spray chamber of an analysis instrument after flowing the flow of gas from the first gas source through the submerged portion of the first selectively permeable tube.

15. The method as recited in claim 14, further comprising:
directing the flow of gas from the first gas source into a nebulizer prior to directing the flow of gas from the first gas source into the spray chamber.

16. The method as recited in claim 13, further comprising:
directing the flow of gas from the second gas source into a spray chamber of an analysis instrument after flowing the flow of gas from the second gas source through the submerged portion of the second selectively permeable tube.

17. The method of claim 13, wherein the flow of gas from the first gas source has a different chemical composition than the flow of gas from the second gas source prior to introduction of the flow of gas from the first gas source to the submerged portion of the first selectively permeable tube and to introduction of the flow of gas from the second gas source to the submerged portion of the second selectively permeable tube.

* * * * *